(12) United States Patent
Hussain et al.

(10) Patent No.: US 7,516,897 B1
(45) Date of Patent: Apr. 14, 2009

(54) DIGITAL AUTOMATIC POWER CONTROL LOOP FOR CONTINUOUS AND BURST MODE APPLICATIONS

(76) Inventors: Kinana Hussain, 10433 Debra Ave., Granada Hills, CA (US) 91344; Adam Wu, 3550 Indian Ridge Cir., Thousand Oaks, CA (US) 91362; Balagopal Mayampurath, 658 Avenida Valencia, Camarillo, CA (US) 93012; Lawrence Choi, 11437 Julius Ave., Downey, CA (US) 90241

( * ) Notice: Subject to any disclaimer, the term of this patent is extended or adjusted under 35 U.S.C. 154(b) by 590 days.

(21) Appl. No.: 11/221,609

(22) Filed: Sep. 7, 2005

(51) Int. Cl.
*G06K 7/10* (2006.01)

(52) U.S. Cl. ............... 235/462.42; 372/38.08

(58) Field of Classification Search ........... 235/462.42, 235/455, 462.06, 462.01; 372/38.08, 29.011, 372/29.021, 38.02, 38.07, 29.02, 32
See application file for complete search history.

(56) References Cited

U.S. PATENT DOCUMENTS

| | | | |
|---|---|---|---|
| 5,216,659 A * | 6/1993 | Call et al. | 369/116 |
| 5,696,370 A * | 12/1997 | Coleman et al. | 235/455 |
| 5,834,750 A * | 11/1998 | Coleman et al. | 235/455 |
| 5,999,549 A | 12/1999 | Freitag et al. | |
| 6,697,397 B2 * | 2/2004 | Theodoras | 372/29.02 |
| 6,697,400 B2 | 2/2004 | Nomura | |
| 6,707,833 B1 | 3/2004 | Kimbrough | |
| 6,792,020 B2 | 9/2004 | Romm | |
| 6,810,051 B2 | 10/2004 | Doil | |
| 6,834,065 B2 | 12/2004 | Couch | |
| 6,885,684 B2 | 4/2005 | Ichino | |
| 6,885,685 B2 | 4/2005 | Hidaka et al. | |
| 7,203,213 B2 * | 4/2007 | Anderson et al. | 372/38.07 |
| 7,215,891 B1 * | 5/2007 | Chiang et al. | 398/137 |
| 7,317,874 B2 * | 1/2008 | Li et al. | 398/72 |
| 2002/0054409 A1 * | 5/2002 | Bartur et al. | 359/152 |
| 2002/0149821 A1 | 10/2002 | Aronson et al. | |
| 2005/0129075 A1 * | 6/2005 | Anderson et al. | 372/38.02 |
| 2006/0215716 A1 * | 9/2006 | Luo et al. | 372/38.08 |

OTHER PUBLICATIONS

Wirbel, Loring, "Driver For Passive Optical Nets Touts Integration", EE Times, May 16, 2005 (3 pgs.).

* cited by examiner

*Primary Examiner*—Thien M Le
(74) *Attorney, Agent, or Firm*—Klein, O'Neill & Singh, LLP

(57) ABSTRACT

An automatic power control circuit for a laser driver includes precharge circuitry to precharge inputs to a comparator receiving an indication of laser output power, for example from a monitor photodiode. The precharge circuitry can be selectively activated when a laser driven by the laser driver is operating in burst mode, as opposed to operating in continuous mode. In addition, a digital up-down counter may be used to increase or decrease a digital value used to set a bias level for the laser, with the digital up-down counter counting up if the comparator indicates the laser output is too low and counting down if the comparator indicates the laser output is too high.

21 Claims, 4 Drawing Sheets

DIGITAL AUTOMATIC POWER CONTROL LOOP FOR CONTINUOUS AND BURST MODE APPLICATIONS

The invention relates generally to laser drivers, and more particularly to automatic laser driver power control.

Lasers are often used in communication systems to generate light carrying information through optical fiber. In some instances a laser is maintained at a substantially constant power level, and light exiting the laser is modulated with a data signal by an external modulator, such as a lithium niobate modulator or an electro-absorption modulator. Such lasers are often termed continuous wave (CW) lasers, and are particularly useful when high quality signals are required and the expense of an external modulator is justified.

In other instances the laser itself is directly modulated with a data signal, with the laser generating light at a high level or low level based on the data signal. Generally, the low level is a power level at which the laser begins to emit light. This avoids delays in transitioning the laser to a high level, and also improves laser signal characteristics. Thus, often a laser will be provided a bias current which biases the laser to a low level, and a modulation current which carries a data signal.

Different lasers, even lasers nominally the same, may vary slightly due to variations in manufacturing processing, aging, temperature differences, and other factors. Circuitry driving the lasers may similarly vary. Accordingly, often laser drivers make use of an automatic power control loop in which light from a laser is measured and adjustments are made to the currents driving the laser, particularly the bias current, based on the measurement. Generally such circuits consider an average output power of the laser, and make adjustments based on the average output power. Such control systems are particularly suited for CW lasers, in which output power from the laser is nominally constant. For directly modulated lasers, the laser is generally constantly transmitting data, and the average measured output power of the laser may also be used.

In some applications, however, the laser operates in a burst mode system, in which data is transmitted in short bursts, followed by a quiescent period. Thus, the laser may only transmit data during certain intervals, while at other intervals the laser does not transmit data at all. As the intervals in which the laser does not transmit data may be lengthy, the average output power of the laser may be of less relevance in determining laser power control.

SUMMARY OF THE INVENTION

The invention provides automatic power control for laser drivers. In one aspect the invention provides automatic power control loop circuitry for a laser driver, comprising a comparator receiving as inputs a first signal indicative of laser output power and a second signal indicative of a reference level; precharge circuitry precharging the inputs to the comparator; digital signal processing circuitry determining a digital laser signal level based on an output of the comparator; and a digital to analog converter converting the digital laser signal level to an analog signal.

In another aspect the invention provides circuitry, on a semiconductor device, for a laser driver automatic power control loop, comprising a counter maintaining a count indicative of a desired laser bias current; and a digital to analog converter receiving a signal indicative of the count indicative of the desired laser bias current and generating a voltage signal indicative of the desired laser bias current; wherein the counter is configured to set the count indicative of the desired laser bias current to a desired value upon assertion of a load signal.

In another aspect the invention provides a method for determining a magnitude for a laser bias current using a single chip semiconductor device including comparing circuitry and count circuitry, comprising setting a digital value indicative of a laser bias current magnitude to an expected desired value; precharging inputs to the comparing circuitry; increasing the digital value using the count circuitry if the digital value if measured laser output power is less than desired laser output power as determined by the comparing circuitry; and decreasing the digital value using the count circuitry if measured laser output power is greater than desired laser output power as determined by the comparing circuitry; generating a voltage based on the digital value, the voltage indicative of a laser bias current magnitude; and generating a laser bias current using the voltage.

In another aspect the invention provides a single semiconductor device including an automatic power control circuit for a laser driver, comprising a monitor diode input pin; first digital to analog converter circuitry; comparator circuitry; a first signal line coupling the monitor diode input pin and a first input of the comparator; a second signal line coupling the digital to analog converter circuitry and a second input of the comparator circuitry; precharge circuitry selectively coupling the first signal line and the second signal line; a plurality of separately selectable resistors coupled to the first signal line; counter circuitry coupled to an output of the comparator circuitry; second digital to analog converter circuitry coupled to an output of the counter circuitry; and digital comparator circuitry coupled to the output of the counter circuitry.

These and other aspects of the invention are more fully comprehended on review of this disclosure, including the accompanying figures.

DETAILED DESCRIPTION

Figure 1:
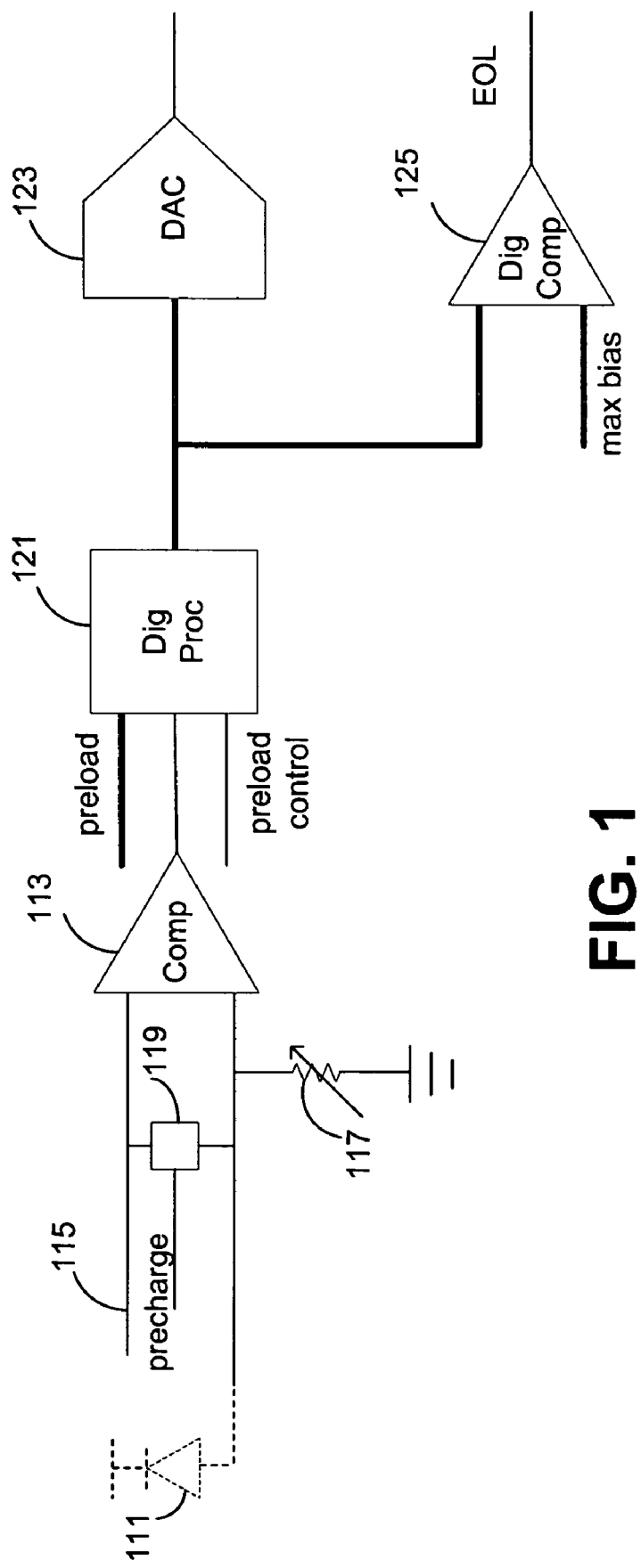
FIG. 1 is a block diagram of a power control circuit in accordance with aspects of the invention.

FIG. 1 shows a block diagram of laser power control circuitry in accordance with aspects of the invention. A photodetector 111 receives light from a laser (not shown). The light may be derived, for example, from a back facet of the laser, with the photodiode approximate the back facet. Alternatively, light may be taken from a tap off a fiber optic line receiving light from the laser, in which case a wavelength locker may be used.

The photodetector, or similar device, generates a current. The current is provided on an input line to a semiconductor circuit. The input line is coupled to a first input of a comparator 113. The input line is also coupled to ground by a resistance, providing a voltage on the input line. In the embodiment of FIG. 1 the resistance is an adjustable resistance 117. The adjustable resistance is adjustable so as to allow a particular input voltage range to be set for the comparator, allowing for system optimization and particularly to account for a range of variations in photodetector output.

Comparator 113 receives a voltage set level 115 as a second input. The voltage set level indicates a desired voltage level, selected to achieve a desired laser output power. Generally the voltage set level is a voltage equivalent to the expected voltage of the first input when the laser is transmitting data and properly biased. An output of the comparator 113 accordingly indicates whether the laser output is above or below a desired level.

The output of the comparator 113 is provided to digital processing circuitry 121. The digital processing circuitry converts the output of the comparator 113 to a digital signal, averages the digital signal, and generates a multi-bit digital bias signal. The digital bias signal indicates a desired bias current for driving the laser. In some embodiments the digital bias signal is generated using an up-down counter, which counts up when the comparator output is high and counts down when the comparator is low.

In some applications, the laser operates in a burst mode, with the laser periodically, or from time to time, changing from an operational mode (transmitting data) to a non-operational mode (not transmitting data). Delays may occur when the laser transitions from a non-operational mode to an operational mode while circuitry, such as comparator 113, sufficiently charges for operation.

Accordingly, a precharge block 119 precharges the inputs to the comparator 113. The precharge block receives a precharge signal. In some embodiments the precharge signal indicates a desired precharge level. More generally, the precharge signal merely indicates that precharging should occur. In the embodiment illustrated, the precharge signal is generally set to indicate precharge when the laser is in the non-operational mode, and set to indicate no precharge during operation of the laser so as not to impact operation of the comparator 113. In some embodiments the precharge signal causes the precharge block to couple together the input lines to the comparator, effectively setting both inputs approximate to the voltage set level. In other embodiment, the precharge block sets either or both inputs to a desired precharge voltage.

In some embodiments the digital processing circuitry is also provided a preload signal. The preload signal allows the digital processing circuitry to set, or preload, the digital bias signal to an initial bias value. The preload signal therefore allows the digital bias signal to be set to an expected or desired value. This is beneficial as it may take some time for a counter, for example, to achieve a proper value, particularly when the laser operates in burst mode. In addition, the preload signal, which may be externally provided, allows for direct control of the digital bias signal.

The digital bias signal is provided to a digital-to-analog converter (DAC) 123. The DAC converts the digital bias signal to an analog signal for conversion, for example, to a bias current signal for use in driving the laser.

In addition, the digital bias signal is provided as a first input to a digital comparator 125. The digital comparator receives as a second input a maximum bias signal. The maximum bias signal indicates a maximum allowable value for the bias signal. Generally, the bias signal reaches the maximum bias signal level when the laser is nearing the end of its useful life. Accordingly, the output of digital comparator 125 is an-end-of life (EOL) signal.

Figure 2:
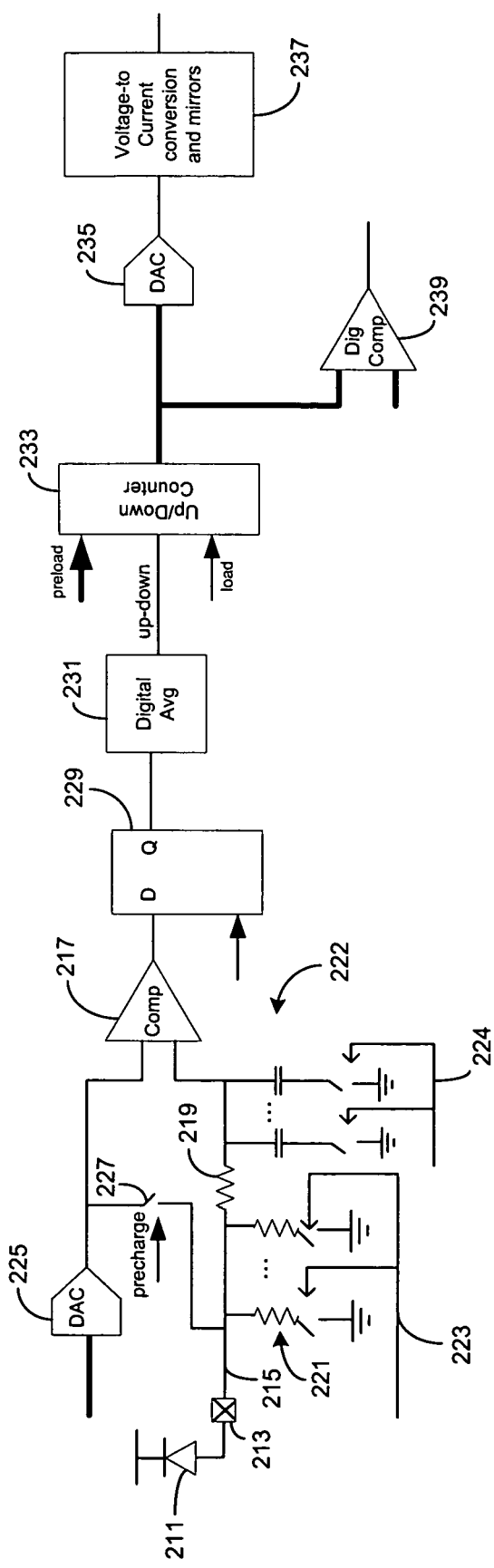
FIG. 2 is a further block diagram/circuit schematic of a power control circuit in accordance with aspects of the invention.

FIG. 2 illustrates a semi-schematic semi-block diagram of a further embodiment in accordance with the invention. In FIG. 2, a photodiode 211 receives light from a laser (not shown). The photodiode generates a current based on the amount of light received. The current flows from a cathode of the photodiode to an input pin 213 of a semiconductor circuit. The current may be termed a monitor diode current, and the pin may be termed a monitor diode pin. The pin is connected to an input line 215. The input line couples the input pin 219 to a first input of a comparator 217 by way of a resistor.

The input line is also coupled to ground by a plurality of selectable resistors 221. The resistors are selectable using a selection signal 223. As illustrated, a plurality of selectable resistors are provided, each individually controllable. In one embodiment the selectable resistors are provided on chip, and may include, for example, twelve selectable resistors. In some embodiments a single resistor is selected for use at any given time, and each resistor has a different resistance.

Similarly, a bank of selectable capacitors 222 is also provided. The capacitors are selectable using a selection signal 224. In some embodiments the selectable capacitors are also provided on chip, and, for example, may include four capacitors. The capacitors allow for filtering of the monitor diode current, allowing a user to optimize monitor diode signal quality and response time.

A comparator 217 compares the voltage on the first input line to a voltage on a second input line. The voltage on the second input line is a set voltage provided by a DAC 225. The DAC is provided a multi-bit data word indicating a desired set voltage, and generates the set voltage based on the multi-bit data word.

The comparator inputs may be precharged by use of a precharge signal. This is particularly useful when the transmitter is turned off and the photodiode is not receiving an input signal. A precharge signal is provided to a switch 227. The switch couples the output of the DAC 225 to the first input line. As illustrated, the connection to the first input line is between the input pin and the resistor between the input pin and the comparator. Closing the switch allows the comparator, as well as any capacitors or other storage devices, to remain charged and thereby reduce charging time when the transmitter transitions from off to on, particularly when a burst-on time is less than burst-off time.

The output of the comparator is provided to a clocked register 229. The clocked register stores a logical one when the set voltage is higher than the monitor diode voltage, stores a zero when the set voltage is lower than the monitor diode voltage, and provides the stored value as a digital signal. The digital signal is provided to a digital averager 231.

The digital averager averages the digital signal data value to suppress transients, such as may occur due to data dependency. The digital averager provides an up-down signal to an up-down counter 233. The up-down signal indicates that the up-down counter should either count up or count down. In some embodiments the digital averager provides a three valued signal, namely up-hold-down, or provides both an up-down signal and an up-down valid signal.

The up-down counter also receives a preload value signal and a load signal. The preload value signal provides a value to which the output of the up-down counter should be set when the load signal is asserted. In some embodiments the load signal is asserted at power up. In some embodiments the load signal is asserted whenever the precharge signal is asserted. In some embodiments the load signal is asserted constantly so as to provide user control of the output of the counter throughout operation of the device.

The output of the up-down counter is a multi-bit digital word indicating a desired bias level. The digital word is provided to a DAC, which converts the digital word to a voltage. The voltage output by the DAC is provided to voltage-to-current conversion and current mirrors block 237. The voltage-to-current conversion and mirrors block generate a bias current signal for use by the laser in some embodiments and for use by off-chip circuitry for driving the laser in other embodiments.

The digital word from the up-down counter is also provided to a digital comparator 239. The digital comparator compares the digital word with a digital word indicating a maximum bias signal. The output of the digital comparator indicates when the up-down counter is attempting to set the digital word to a value outside the operating parameters for the bias signal.

In some embodiments a burst enable signal indicates whether the laser is to transmit data. In some such embodiments the clocked register, the counter and other clocked circuits, use a transition in the burst enable signal, such as the transition from a non-transmit state to a transmit state, as a clock signal. In some of these embodiments the clock signal is selectable between a burst enable signal, or signal based thereon or indicative thereof, and another clock signal such as derived from a local oscillator.

Figure 3:
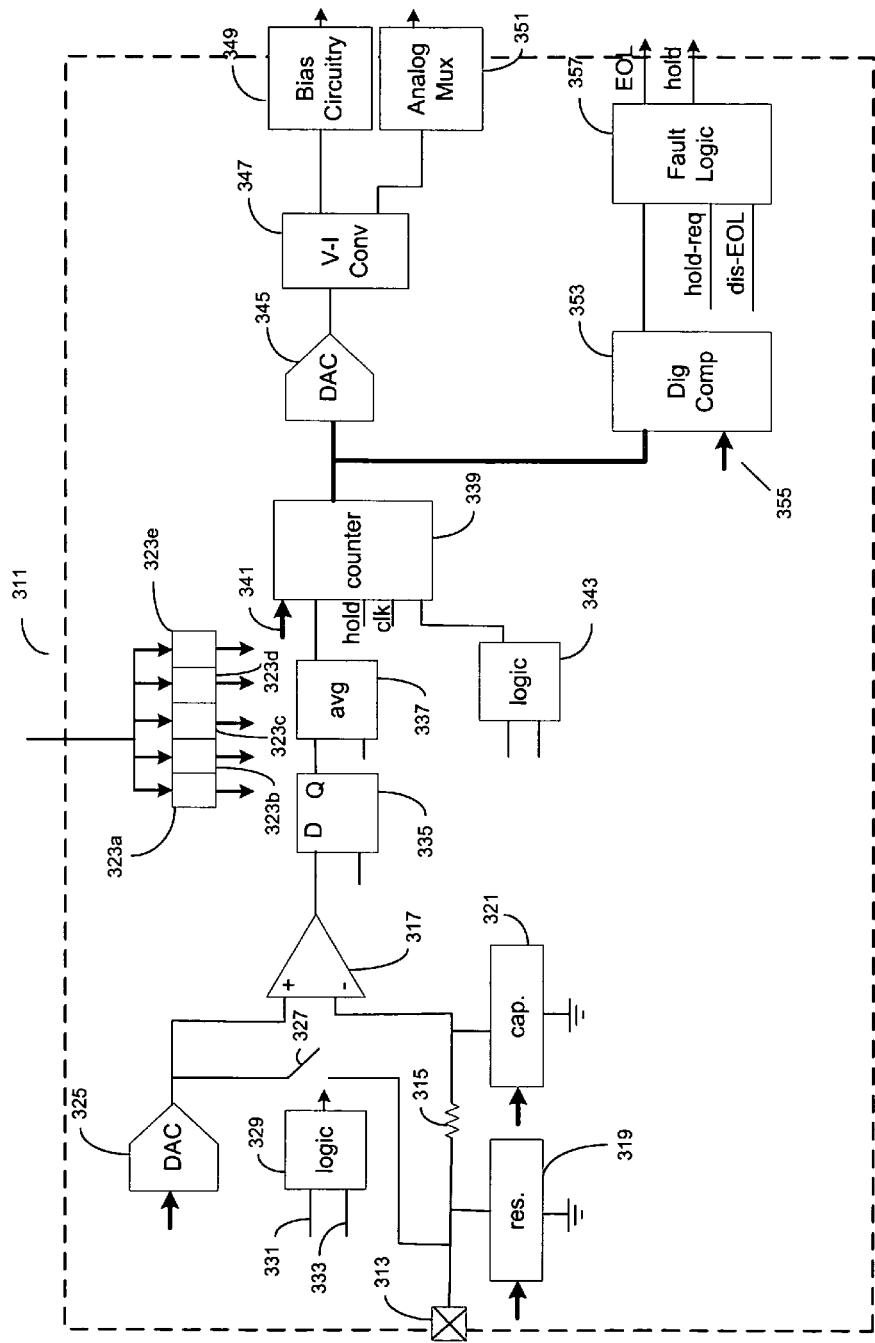
FIG. 3 is a still further block diagram/circuit schematic of a power control circuit in accordance with aspects of the invention.

FIG. 3 illustrates a further semi-block diagram semi-schematic of an automatic power control circuit in accordance with aspects of the invention. FIG. 3 illustrates portions of a single chip semiconductor circuit 311. The semiconductor circuit includes a monitor diode input pin 313. The monitor diode pin is coupled by way of a resistor 315 to a first input of a comparator 317. The monitor diode pin is also coupled to ground by a bank of selectable resistors 319, while the first input of a comparator is also coupled to ground by way of a bank of selectable capacitors 321. The selectable resistors are selected by way of a resistor selection signal. The resistance selection signal is stored on an on-chip register 323a. The register, along with registers 323b-e, may be set by use of a programming interface or other similar interface. Similarly, capacitors of the selectable capacitor bank are selected by a capacitance selection signal, which is also set and stored in the on-chip registers.

The comparator compares the first input, representative of the monitor diode signal, with the second input provided by a DAC 325.

The DAC 325 sets the magnitude of the second input by converting a multi-bit digital input to an analog signal. The multi-bit digital input is stored in register 323b, which as indicated above may be set by the use of a programming interface or other similar interface. Accordingly, the register 323b may be set by a user or preconfigured for operation to a value indicative of a particular voltage.

The output of the DAC 325 is coupled to the monitor diode input by a switch 327. A logic block 329 controls operation of the switch. The logic block receives a precharge disable signal 331 and burst enable signal 333. The burst enable signal indicates burst mode is enabled. The logic block 329 sets the switch 327 to open when either the precharge disable signal indicates that precharge should be disabled or the burst enable signal indicates burst mode is enabled.

The output of the comparator 317 is provided to a digitizer 335. The digitizer digitizes the output of the comparator in a clocked manner, with the digitizer also receiving as a clock input the burst enable signal. In some embodiments the digitizer is a clocked register or a latch.

The output of the digitizer is received by a digital averager 337. The digital averager averages the digitized data, for example to remove transient or data dependency effects. The output of the digital averager is provided as an up-down signal counter 339. The counter counts up or down depending on the value received from the digital averager. The counter counts up and down in a clocked manner, with the counter receiving the burst enable signal as a clock signal. The counter also receives a hold signal indicating the counter should not count up or down.

The counter also is able to be preloaded with a desired value. The desired value is provided as a preload signal 341. The preload signal is a multi-bit signal indicating a desired output value of the counter. The counter sets its output to the value of the preload signal when a load signal is asserted. The load signal is asserted based on determination by logic block 343. In many embodiments the load signal is asserted based on a user programmable command.

A multi-bit output signal of the counter is provided to DAC 345. The DAC 345 converts the multi-bit signal to an analog voltage. The voltage is provided to a voltage-to-current converter 347. In some embodiments the voltage-to-current converter is in a voltage-to-current converter block, and includes circuitry such as current mirrors for performing functions such as isolation of the output from the input and appropriate scaling of the output current.

The output current is a bias current. The bias current is provided to bias circuitry 349. A bias monitor voltage is also provided, in the embodiment of FIG. 3 by the voltage to current converter, to an analog MUX 351. The analog MUX outputs the bias monitor voltage, and other signals (not discussed) in accordance with a selection signal.

The multi-bit output signal generated by the counter 339 is also provided to a digital comparator 353. The digital comparator 353 also receives a multi-bit signal 355. The multi-bit signal 355 is stored in a register 323e, and represents a maximum bias value. Generally the maximum bias value is a value approximate a maximum bias voltage, and often indicates that the laser is nearing the end of its useful life. The output of the digital comparator is provided to a fault logic block 357, which also receives a hold request signal and a disable EOL signal. The fault logic block outputs an end-of-life (EOL) signal and the hold signal, which was previously mentioned with respect to the counter block.

The EOL signal is set when the digital comparator indicates the bias value has reached the maximum bias value and the disable EOL signal is not set. The hold signal is set when the bias value has reached the maximum bias value or the hold request signal is set. The hold request signal is user programmable, allowing a user, in conjunction with the preload signal, to set a specific bias value.

Figure 4:
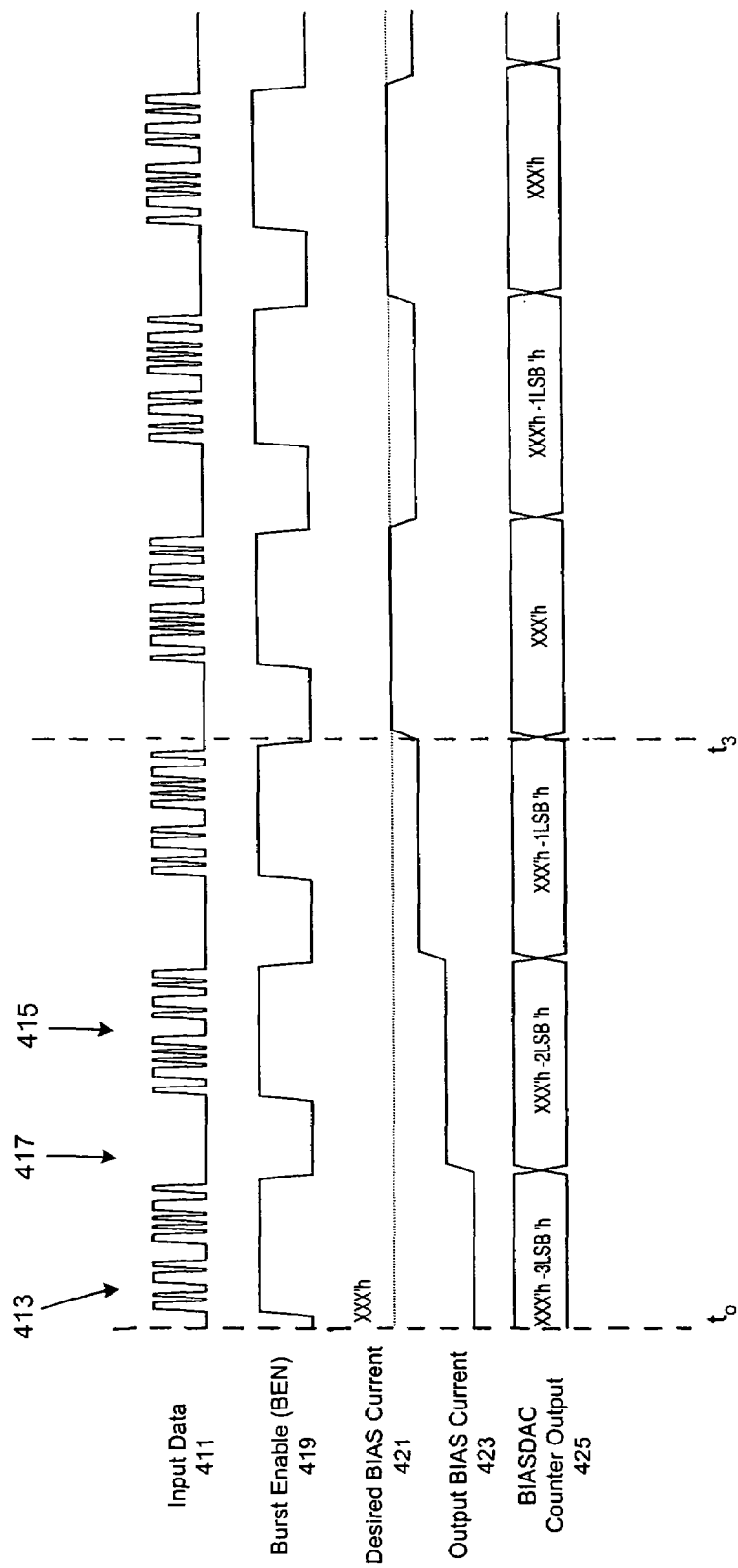
FIG. 4 is a timing diagram showing signals in accordance with aspects of the invention.

FIG. 4 illustrates signals in accordance with aspects of the invention, such as associated with FIG. 1, 2 or 3. Input data 411 shows data received at a monitor diode pin. The input data reflects activation of a laser during time periods, such as time periods 413 and 415. During other time periods, such as time period 417, which is between time period 413 and 415, the laser is inactive. The laser is active during burst enable periods, as shown by a burst enable signal 419. The burst enable signal also makes from a high level to a low level, with transmission by the laser enabled during burst enable. A desired bias current 421 is indicated in conjunction with output bias current 423. At time t0 the output bias current is below the desired bias current.

FIG. 4 also shows the bias DAC counter output 425. The bias DAC counter output is initially at a hex value which is three values below the desired bias current. As illustrated in FIG. 4, the desired bias current is XXXh, with the bias DAC counter output at time t0 being XXXh-3LSBh and at time t0 the counter output is equal to the value provided by the bias preload signal. At a time $t_3$ operation of the circuit, such as circuits of FIG. 1, 2 or 3, with clocked circuitry of those figures clocked on a rising edge of a burst enable signal, achieves a bias DAC counter output of XXXh and a corresponding output bias current equal to a desired bias current. The desired bias current output thereafter toggles, in response to changes to the bias DAC counter output of one least significant bit as the counter toggles.

Accordingly, the invention provides that some aspects an automatic power control circuit for a laser driver. Although the invention has been described with respect to certain embodiments, it should be recognized that the invention may be practiced otherwise than as specifically described, and the invention should be considered the claims and their equivalents supported by this disclosure.

What is claimed is:

1. Automatic power control loop circuitry for a laser driver, comprising:
    a comparator receiving as inputs a first signal indicative of laser output power and a second signal indicative of a reference level;
    precharge circuitry precharging the inputs to the comparator;
    digital signal processing circuitry determining a digital laser signal level based on an output of the comparator; and
    a digital to analog converter converting the digital laser signal level to an analog signal.

2. The circuitry of claim 1 wherein the precharge circuitry selectively couples the inputs to the comparator.

3. The circuitry of claim 2 wherein the precharge circuitry selectively couples the inputs to the comparator based on a precharge signal.

4. The circuitry of claim 3 wherein the precharge signal indicates that burst mode is not enabled.

5. The circuitry of claim 1 wherein the first signal is on a first signal line and the first signal line couples the first input of the comparator to a monitor diode and couples the first input of the comparator to a common by way of a selectable resistance.

6. The circuitry of claim 5 wherein the selectable resistance is provided by resistors.

7. The circuitry of claim 6 wherein the resistors are each selectively coupled to the first input of the comparator by control signals.

8. The circuitry of claim 1 wherein the digital signal processing circuitry additionally receives a preload signal, and sets the digital laser signal level based on the preload signal.

9. Circuitry on a semiconductor device for a laser driver automatic power control loop, comprising:
    a counter maintaining a count indicative of a desired laser bias current; and
    a digital to analog converter receiving a signal indicative of the count indicative of the desired laser bias current and generating a voltage signal indicative of the desired laser bias current;
    wherein the counter is configured to set the count indicative of the desired laser bias current to a desired value upon assertion of a load signal.

10. The circuitry of claim 9 wherein the desired value is stored in a register.

11. The circuitry of claim 9 wherein the counter is further configured to increment the count indicative of a desired laser bias current based on an increment signal.

12. The circuitry of claim 11 wherein the counter is further configured to decrement the count indicative of a desired laser bias current based on a decrement signal.

13. The circuitry of claim 12 wherein the increment signal and the decrement signal are provided by different values for the same signal.

14. The circuitry of claim 13 further comprising a comparator comparing a signal indicative of laser output power and a signal indicative of desired laser output power and generating a comparison signal indicative of the comparison, and wherein the increment signal and the decrement signal are indicative of the comparison signal.

15. The circuitry of claim 14 further comprising precharge circuitry selectively coupling a signal line for the signal indicative of laser output power and a signal line for the signal indicative of desired laser output power.

16. The circuitry of claim 15 wherein the precharge circuitry selectively couples the signal line for the signal indicative of laser output power and the signal line for the signal indicative of desired laser output power during an inactive period of a laser.

17. The circuitry of claim 14 further comprising resistors each selectively coupled to a signal line for the signal indicative of laser output power.

18. The circuitry of claim 17 further comprising a register storing a value indicating which resistors should be coupled to the signal line for the signal indicative of laser output power.

19. A method for determining a magnitude for a laser bias current using a single chip semiconductor device including comparing circuitry and count circuitry, comprising:
    setting a digital value indicative of a laser bias current magnitude to an expected desired value;
    precharging inputs to the comparing circuitry;
    increasing the digital value using the count circuitry if the digital value if measured laser output power is less than desired laser output power as determined by the comparing circuitry; and
    decreasing the digital value using the count circuitry if measured laser output power is greater than desired laser output power as determined by the comparing circuitry;
    generating a voltage based on the digital value, the voltage indicative of a laser bias current magnitude; and
    generating a laser bias current using the voltage.

20. A single semiconductor device including an automatic power control circuit for a laser driver, comprising:
    a monitor diode input pin;
    first digital to analog converter circuitry;
    comparator circuitry;
    a first signal line coupling the monitor diode input pin and a first input of the comparator;
    a second signal line coupling the digital to analogs converter circuitry and a second input of the comparator circuitry;
    precharge circuitry selectively coupling the first signal line and the second signal line;
    a plurality of separately selectable resistors coupled to the first signal line;
    counter circuitry coupled to an output of the comparator circuitry;
    second digital to analog converter circuitry coupled to an output of the counter circuitry; and
    digital comparator circuitry coupled to the output of the counter circuitry.

21. The single semiconductor device of claim 20 further comprising a digital averager, the digital averager being part of a signal pathway coupling the counter circuitry and the comparator circuitry.

* * * * *

UNITED STATES PATENT AND TRADEMARK OFFICE
CERTIFICATE OF CORRECTION

PATENT NO. : 7,516,897 B1  Page 1 of 1
APPLICATION NO. : 11/221609
DATED : April 14, 2009
INVENTOR(S) : Hussain et al.

It is certified that error appears in the above-identified patent and that said Letters Patent is hereby corrected as shown below:

Column 6, Line 56    change "At time to the output bias" to --At time $t_o$ the output bias--

Column 6, Line 62    change "time to being XXXh-3LSBh and at time to" to --time $t_o$ being XXXh-3LSBh and at time $t_o$--

Column 8, Line 47, Claim 20    change "coupling the digital to analogs" to --coupling the digital to analog--

Signed and Sealed this

Ninth Day of February, 2010

David J. Kappos
*Director of the United States Patent and Trademark Office*